(12) United States Patent
Wu (10) Patent No.: US 12,158,442 B2
(45) Date of Patent: Dec. 3, 2024

(54) IC STRUCTURE MOISTURE INGRESS DETECTION BY CURRENT HUMP IN CURRENT-VOLTAGE RESPONSE CURVE

(71) Applicant: GlobalFoundries U.S. Inc., Malta, NY (US)

(72) Inventor: Zhuojie Wu, Port Chester, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 153 days.

(21) Appl. No.: 17/929,404

(22) Filed: Sep. 2, 2022

(65) Prior Publication Data

US 2024/0077445 A1 Mar. 7, 2024

(51) Int. Cl.
*G01N 27/22* (2006.01)
(52) U.S. Cl.
CPC ......... *G01N 27/223* (2013.01); *G01N 27/226* (2013.01); *G01N 27/228* (2013.01)
(58) Field of Classification Search
CPC .................................................. G01N 27/223
USPC .................... 324/658, 660–663, 679, 686
See application file for complete search history.

(56) References Cited

U.S. PATENT DOCUMENTS

| | | | |
|---|---|---|---|
| 7,098,676 B2 | 8/2006 | Landers et al. | |
| 9,947,602 B2 | 4/2018 | Wu et al. | |
| 10,060,974 B2 | 8/2018 | Fry et al. | |
| 10,770,407 B2 | 9/2020 | Wu et al. | |
| 2012/0000284 A1 | 1/2012 | Yokoyama et al. | |
| 2012/0000285 A1 | 1/2012 | Waga et al. | |
| 2016/0327502 A1* | 11/2016 | Chen | G01D 5/2405 |
| 2017/0110416 A1 | 4/2017 | Miao et al. | |
| 2020/0319675 A1* | 10/2020 | Beckham | G06F 1/182 |
| 2021/0183791 A1 | 6/2021 | Sahin et al. | |

OTHER PUBLICATIONS

Office Action from related U.S. Appl. No. 18/058,349 dated Sep. 9, 2024, 18 pages.

* cited by examiner

*Primary Examiner* — Vincent Q Nguyen
(74) *Attorney, Agent, or Firm* — Francois Pagette; Hoffman Warnick, LLC (57) ABSTRACT

An integrated circuit (IC) structure includes a moisture barrier about active circuitry. A capacitor is entirely inside the moisture barrier. The capacitor has a breakdown voltage. A moisture detector is configured to apply an increasing voltage ramp to the capacitor up to a maximum voltage less than the breakdown voltage of the capacitor. In response to determining that a current hump exists in a test current-voltage response curve of the capacitor to the increasing voltage ramp, the detector transmits a signal to the active circuitry to indicate a presence of moisture in the IC structure. The moisture detector is accurate and sensitive to moisture ingress, which provides more time for remedial action. The detector is non-destructive and can be used in a final IC product.

20 Claims, 8 Drawing Sheets

IC STRUCTURE MOISTURE INGRESS DETECTION BY CURRENT HUMP IN CURRENT-VOLTAGE RESPONSE CURVE

BACKGROUND

The present disclosure relates to integrated circuit (IC) structures and, more particularly, to moisture detection in an IC structure.

Integrated circuit (IC) structures or chips can fail or be damaged when moisture enters the structure. Some moisture detection techniques, such as a leakage test, are inaccurate or lack sensitivity. Hence, these techniques oftentimes result in late detection of moisture when remedial action may be impossible. Other moisture detection techniques perform destructive tests, such as a voltage breakdown shift test or a time dependent breakdown (TDDB) test, and cannot be used in a final IC chip product.

SUMMARY

All aspects, examples and features mentioned below can be combined in any technically possible way.

An aspect of the disclosure provides an integrated circuit (IC) structure, comprising: a moisture barrier about active circuitry; a capacitor entirely inside the moisture barrier, the capacitor having a breakdown voltage; and a moisture detector configured to apply an increasing voltage ramp to the capacitor up to a maximum voltage less than the breakdown voltage of the capacitor and in response to determining that a current hump exists in a test current-voltage response curve of the capacitor to the increasing voltage ramp, transmitting a signal to the active circuitry to indicate a presence of moisture in the IC structure.

Another aspect of the disclosure includes any of the preceding aspects, and the current hump is indicated by a negative slope in the test current-voltage response curve.

Another aspect of the disclosure includes any of the preceding aspects, and the moisture detector performs the processes: first applying the increasing voltage ramp to the capacitor and recording a reference current-voltage response curve of the capacitor to the increasing voltage ramp; second applying the increasing voltage ramp to the capacitor to obtain a test current-voltage response curve of the capacitor to the increasing voltage ramp; determining the existence of the current hump by calculating a current differential existing in the test current-voltage response curve compared to the reference current-voltage response curve, the current differential existing at a voltage less than the maximum voltage of the increasing voltage ramp; in response to the current differential not exceeding a positive threshold, repeating the second applying and the calculating; and in response to the current differential exceeding a positive threshold, transmitting the signal to the active circuitry to indicate the presence of moisture in the IC structure.

Another aspect of the disclosure includes any of the preceding aspects, and the capacitor includes a plurality of capacitors, and wherein the second applying includes applying the increasing voltage ramp to each capacitor up to less than the breakdown voltage of the respective capacitor, and wherein the calculating includes calculating the current differential existing in the test current-voltage response curve compared to the reference current-voltage response curve for each capacitor of the plurality of capacitors; wherein in response to all of the current differentials not exceeding a positive threshold, the moisture detector repeats the second applying and the calculating for the plurality of capacitors; and in response to at least one of the current differentials exceeding a positive threshold, the moisture detector transmits the signal to active circuitry to indicate the presence of moisture in the IC structure.

Another aspect of the disclosure includes any of the preceding aspects, and the transmitting the signal to active circuitry to indicate the presence of moisture in the IC structure occurs only in response to more than one capacitor having a test current-voltage response curve having the respective current differential exceed a positive threshold.

Another aspect of the disclosure includes any of the preceding aspects, and the capacitor includes a plurality of capacitors and the moisture detector performs the processes: first applying the increasing voltage ramp to at least one capacitor of the plurality of capacitors and recording a reference current-voltage response curve for each capacitor to the increasing voltage ramp; second applying the increasing voltage ramp to a first capacitor of the plurality of capacitors to obtain a first test current-voltage response curve of the first capacitor to the increasing voltage ramp, and determining the existence of the current hump includes determining the existence of a first current hump by first calculating a first current differential existing in the first test current-voltage response curve compared to a reference current-voltage response curve for the first capacitor of the plurality of capacitors; in response to the first current differential not exceeding a first positive threshold, repeating the second applying and the first calculating for the first capacitor of the plurality of capacitors; in response to the first current differential exceeding a positive threshold: third applying the increasing voltage ramp to a second capacitor of the plurality of capacitors different than the first capacitor to obtain a second test current-voltage response curve of the second capacitor to the increasing voltage ramp, and determining the existence of a second current hump by second calculating a second current differential existing in the second test current-voltage response curve compared to a reference current-voltage response curve for the second capacitor of the plurality of capacitors; in response to the second current differential not exceeding a second positive threshold, repeating the third applying and the second calculating for the second capacitor of the plurality of capacitors; and in response to the second current differential exceeding the second positive threshold, transmitting the signal to the active circuitry to indicate the presence of moisture in the IC structure.

Another aspect of the disclosure includes any of the preceding aspects, and the capacitor is located adjacent a moisture ingress path in the moisture barrier.

Another aspect of the disclosure includes any of the preceding aspects, and the capacitor is located within 10000 nanometers of the moisture ingress path.

Another aspect of the disclosure includes any of the preceding aspects, and the capacitor is located more than $1 \times 10^7$ nanometers from a moisture ingress path in the moisture barrier.

Another aspect of the disclosure includes any of the preceding aspects, and further comprising a photonics component adjacent a moisture ingress path in the moisture barrier.

Another aspect of the disclosure includes any of the preceding aspects, and the capacitor includes a metal-insulator-metal (MIM) capacitor entirely within the moisture barrier and including a first metal electrode separated from a second metal electrode by a dielectric layer, wherein the first metal electrode includes a first plurality of digitated elements, and the second metal electrode includes a second plurality of digitated elements.

An aspect of the disclosure includes an integrated circuit (IC) structure, comprising: a moisture barrier about active circuitry; a capacitor entirely inside the moisture barrier, the capacitor having a breakdown voltage; and a moisture detector configured to: first apply an increasing voltage ramp to the capacitor and record a reference current-voltage response curve of the capacitor to the increasing voltage ramp; second apply the increasing voltage ramp to the capacitor to obtain a test current-voltage response curve of the capacitor to the increasing voltage ramp; determine the existence of a current hump in a test current-voltage response curve of the capacitor to the increasing voltage ramp by calculating a current differential existing in the test current-voltage response curve compared to the reference current-voltage response curve, the current differential existing at a voltage less than the maximum voltage of the increasing voltage ramp; in response to the current differential not exceeding a positive threshold, repeating the second applying and the calculating; and in response to the current differential exceeding a positive threshold, transmitting a signal to the active circuitry to indicate the presence of moisture in the IC structure.

Another aspect of the disclosure includes any of the preceding aspects, and the current hump is indicated by a negative slope in the test current-voltage response curve.

Another aspect of the disclosure includes any of the preceding aspects, and the capacitor includes a plurality of capacitors, and wherein the increasing voltage ramp is applied to each capacitor up to less than the breakdown voltage of the respective capacitor, and wherein the calculating includes calculating the current differential existing in the test current-voltage response curve compared to the reference current-voltage response curve for each capacitor of the plurality of capacitors; wherein in response to all of the current differentials not exceeding a positive threshold, the moisture detector repeats the second applying and the calculating for the plurality of capacitors; and in response to at least one of the current differentials exceeding a positive threshold, transmitting the signal to active circuitry to indicate the presence of moisture in the IC structure.

An aspect of the disclosure relates to a method, comprising: applying an increasing voltage ramp to at least one capacitor in an integrated circuit (IC) structure up to less than a breakdown voltage of the at least one capacitor, each capacitor positioned entirely within a moisture barrier of the IC structure; and in response to a current hump existing in a current-voltage response curve of the at least one capacitor to the increasing voltage ramp, transmitting a signal to the active circuitry to indicate a presence of moisture in the IC structure.

Another aspect of the disclosure includes any of the preceding aspects, and the current hump is indicated by a negative slope in the current-voltage response curve.

Another aspect of the disclosure includes any of the preceding aspects, and the applying includes: first applying the increasing voltage ramp to the capacitor and recording a reference current-voltage response curve of the capacitor to the increasing voltage ramp; and second applying the increasing voltage ramp to the capacitor to obtain a test current-voltage response curve of the capacitor to the increasing voltage ramp; wherein determining the existence of the current hump includes: calculating a current differential existing in the test current-voltage response curve compared to the reference current-voltage response curve, the current differential existing at a voltage less than the maximum voltage of the increasing voltage ramp; in response to the current differential not exceeding a positive threshold, repeating the second applying and the calculating; and in response to the current differential exceeding a positive threshold, indicating the existence of the current hump, transmitting the signal to the active circuitry to indicate the presence of moisture in the IC structure.

Another aspect of the disclosure includes any of the preceding aspects, and the capacitor includes a plurality of capacitors, and wherein the increasing voltage ramp is applied to each capacitor up to less than the breakdown voltage of the respective capacitor, and wherein the calculating includes calculating the current differential existing in the test current-voltage response curve compared to the reference current-voltage response curve for each capacitor of the plurality of capacitors; wherein in response to all of the current differentials not exceeding a positive threshold, the moisture detector repeats the second applying and the calculating for the plurality of capacitors; and in response to at least one of the current differentials exceeding a positive threshold, indicating the existence of the current hump, transmitting the signal to the active circuitry to indicate the presence of moisture in the IC structure.

Another aspect of the disclosure includes any of the preceding aspects, and the transmitting the signal to active circuitry to indicate the presence of moisture in the IC structure occurs only in response to more than one capacitor having a test current-voltage response curve having the respective current differential exceed a positive threshold.

Another aspect of the disclosure includes any of the preceding aspects, and the capacitor includes a plurality of capacitors and the moisture detector performs the processes: first applying the increasing voltage ramp to at least one capacitor of the plurality of capacitors and recording a reference current-voltage response curve for each capacitor to the increasing voltage ramp; second applying the increasing voltage ramp to a first capacitor of the plurality of capacitors to obtain a first test current-voltage response curve of the first capacitor to the increasing voltage ramp, and determining the existence of the current hump includes determining the existence of a first current hump by first calculating a first current differential existing in the first test current-voltage response curve compared to a reference current-voltage response curve for the first capacitor of the plurality of capacitors; in response to the first current differential not exceeding a first positive threshold, repeating the second applying and the first calculating for the first capacitor of the plurality of capacitors; in response to the first current differential exceeding a positive threshold: third applying the increasing voltage ramp to a second capacitor of the plurality of capacitors different than the first capacitor to obtain a second test current-voltage response curve of the second capacitor to the increasing voltage ramp, and determining the existence of a second current hump by second calculating a second current differential existing in the second test current-voltage response curve compared to a reference current-voltage response curve for the second capacitor of the plurality of capacitors; in response to the second current differential not exceeding a second positive threshold, repeating the third applying and the second calculating for the second capacitor of the plurality of capacitors; and in response to the second current differential exceeding the second positive threshold, transmitting the signal to the active circuitry to indicate the presence of moisture in the IC structure.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure including a moisture barrier about active circuitry. A capacitor is entirely inside the moisture barrier. The capacitor has a breakdown voltage. A moisture detector is configured to apply an increasing voltage ramp to the capacitor up to a maximum voltage less than the breakdown voltage of the capacitor. In response to determining that a current hump exists in a test current-voltage response curve of the capacitor to the increasing voltage ramp, the detector transmits a signal to the active circuitry to indicate a presence of moisture in the IC structure. Remedial action can then be taken based on the moisture indication. The moisture detector is accurate and sensitive to moisture ingress, which provides more time for remedial action. The detector is non-destructive and can be used in a final IC product.

Figure 1:
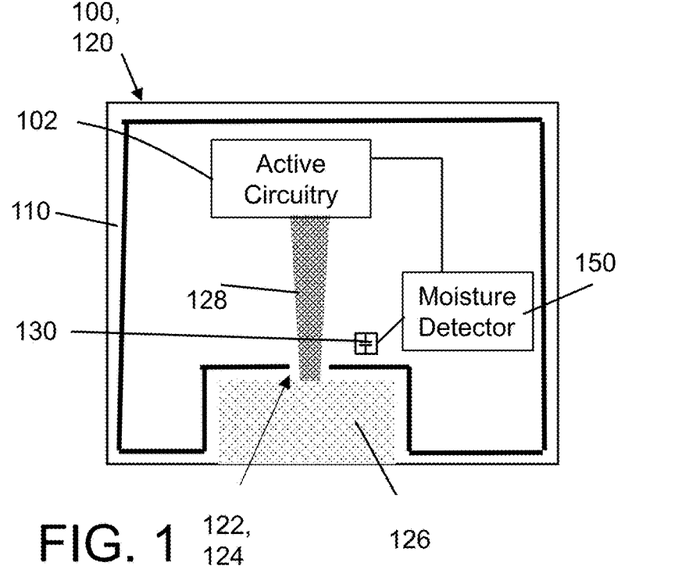
FIG. 1 shows a schematic top-down view of an IC structure including a moisture detector, according to embodiments of the disclosure.

FIG. 1 shows a schematic top-down view of an integrated circuit (IC) structure 100, according to embodiments of the disclosure. IC structure 100 may include any now known or later developed integrated circuit structure or chip including any variety of active circuitry 102 that may experience moisture ingress. Active circuitry 102 can include any form of circuitry including but not limited to: logic, memory, and/or photonics. Moisture ingress into IC structure 100 and active circuitry 102 can damage the physical structure of, for example, active circuitry 102, interconnect layers, photonics, etc. To prevent moisture ingress, IC structure 100 includes a moisture barrier 110 about active circuitry 102. Moisture barrier 110 may include any now known or later developed barrier configured to resist, and ideally prevent, moisture ingress, e.g., stacks of back-end-of-line interconnect layers. As understood in the field, moisture barrier 110 may also provide electric guard ring functionality. For purposes of description, IC structure 100 is illustrated as a photonics integrated circuit (PIC) structure 120. PIC structures 120 present a heightened risk of moisture ingress because they include one or more moisture ingress paths 122, e.g., openings 124 or other mechanisms, through which moisture can pass through moisture barrier 110. Openings 124 are provided to allow connection of external photonics components 126, such as an optical fiber (perhaps coupled to, e.g., an external laser). In this case, IC structure 100 includes photonics component 126 adjacent moisture ingress path 122, e.g., a V-groove, in moisture barrier 110. External photonics components(s) 126 may be coupled to, for example, internal optical waveguides 128 that are optically coupled to active circuitry 102 in a known fashion. Early and accurate detection of moisture ingress of IC structure 100 allows for remedial action to be taken before it is impossible. The type of remedial action can vary depending on factors such as but not limited to: the age of IC structure 100, risks associated with any downtime of IC structure 100, or the availability of redundancy in active circuitry 102 or other components in IC structure 100.

IC structure 100 includes a capacitor 130 entirely inside moisture barrier 110. Capacitor 130 can include any now known or later developed capacitor structure. In one embodiment, capacitor 130 may include a metal-insulator-metal (MIM) capacitor entirely within moisture barrier 110. MIM capacitors include a first metal electrode separated from a second metal electrode by a dielectric layer.

Figure 2:
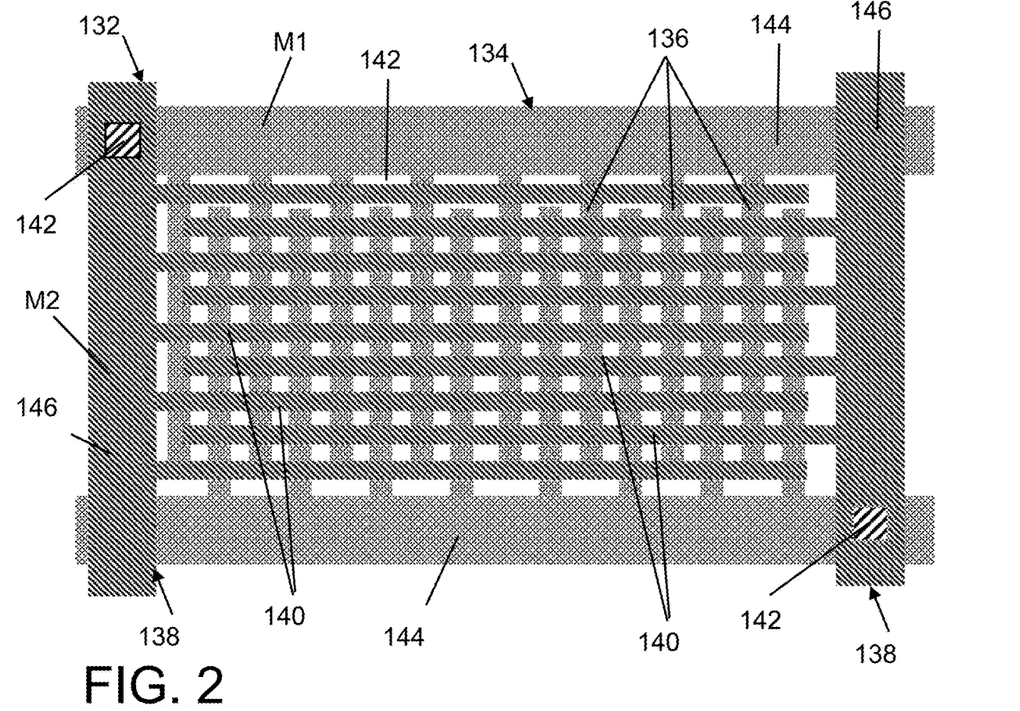
FIG. 2 shows a schematic top-down view of an illustrative capacitor for use in an IC structure, according to embodiments of the disclosure.

FIG. 2 shows a schematic top-down view of one example MIM capacitor 132. MIM capacitor 132 includes a first metal electrode 134 that includes a first plurality of digitated elements 136, and a second metal electrode 138 includes a second plurality of digitated elements 140. Sets of digitated elements 136, 140 are coupled by respective connectors or backbones 144, 146. First metal electrode 134 may be positioned in a first metal layer, e.g., M1, and second metal electrode 138 may be positioned in a second, different metal layer, e.g., M2. Vias 142 may couple to electrodes 134, 138 in a known fashion, e.g., using a first via layer (V1) between metal layers M1, M2. A dielectric layer 142 is vertically between electrodes 134, 138. Metal electrodes 134, 138 can include any conductive metal appropriate for complementary metal-oxide semiconductor (CMOS) systems, e.g., copper, tantalum. Dielectric layer 142 may include any capacitor dielectric or interlayer dielectric material, e.g., silicon nitride, silicon oxide, low-k dielectrics. While electrodes 134, 138 are described in adjacent metal layers, e.g., in any back-end-of-line (BEOL) interconnect layers of IC structure 100, they do not need to be in adjacent layers. Capacitors 130 can also include MIM capacitors with electrode arrangements other than digitated elements 136, 140, such as but not limited to: parallel metal plate electrodes, metal comb-comb electrode arrangements, vertical native capacitor (VNCAP) arrangements, metal comb and/or serpentine electrode arrangements, and intertwined via-chain arrangements.

Figure 4:
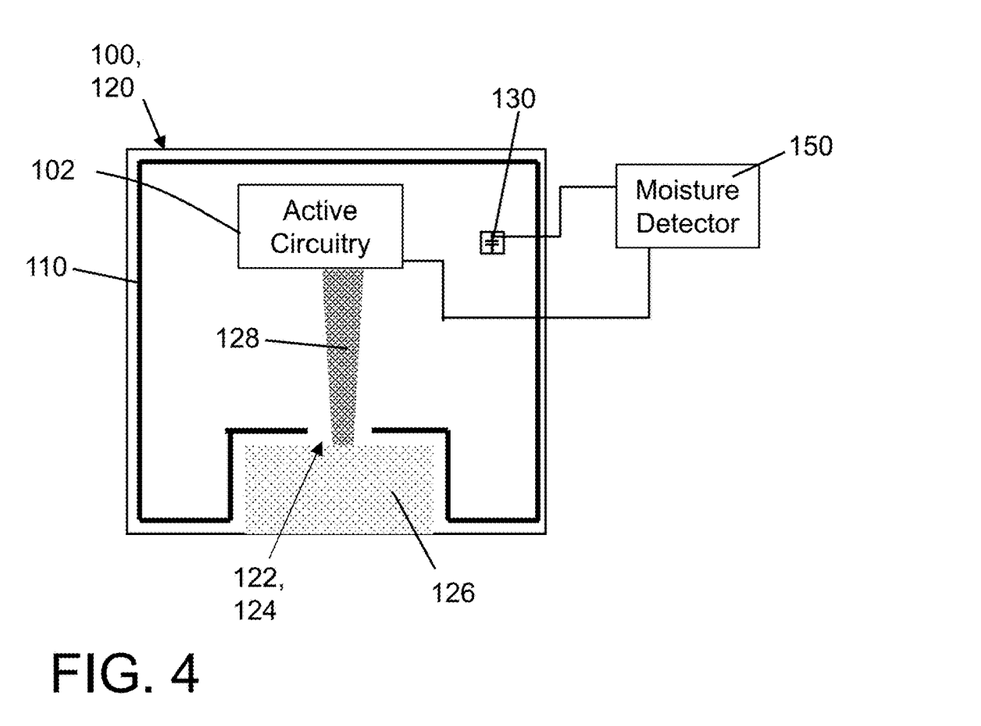
FIG. 4 shows a schematic top-down view of an IC structure including a moisture detector, according to additional embodiments of the disclosure.

Capacitor 130 can be positioned in any location at which moisture detection is desired. For example, as shown in FIGS. 1 and 2, capacitor 130 may be located adjacent a moisture ingress path 122, e.g., opening 124, in moisture barrier 110. In one example, capacitor 130 may be located within 10000 nanometers of moisture ingress path 122. In other embodiments, as shown in FIG. 4, capacitor 130 may be located distant from moisture ingress path, e.g., where detection of moisture ingress and travel within IC structure 100 is desired. In this case, capacitor 130 may be any distance within IC structure 100 from moisture ingress path 122 in moisture barrier 110, e.g., $1 \times 10^7$ nanometers (10 millimeters).

Figure 3:
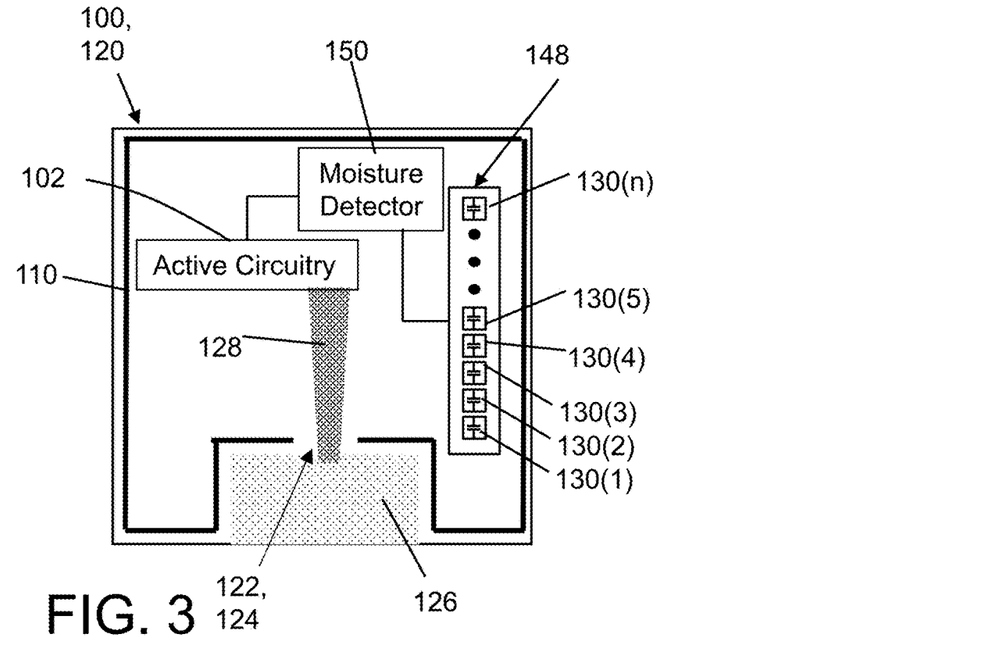
FIG. 3 shows a schematic top-down view of an IC structure including a moisture detector, according to other embodiments of the disclosure.

In other embodiments, shown in FIG. 3, capacitor 130 may include a plurality of capacitors 148 with a moisture detector 150 coupled to each capacitor. Plurality of capacitors 148 may include any number of capacitors 130(1)-130(n) therein and may be arranged in any manner within IC structure 100. While shown as a line of capacitors 130(1)-(n), they can be distributed in any manner, e.g., evenly spaced, in an array, non-uniformly spaced, located near likely moisture ingress paths, or located distant from likely moisture ingress paths. In this manner, plurality of capacitors 148 can be positioned in any location at which moisture ingress detection is desired in IC structure 100.

Referring to FIGS. 1 and 3, IC structure 100 also includes a moisture detector 150. Moisture detector 150 can be internal of moisture barrier 110 and be a permanent part of a final IC product. While shown as a separate entity, moisture detector 150 may be part of active circuitry 102. In other embodiments, as shown in FIG. 4, moisture detector 150 may be external to IC structure 100, e.g., in the form of an external tester used to test IC structure 100 after manufacture thereof. Moisture detector 150 can include any hardware and/or software capable of performing the functions described herein.

Figure 5A:
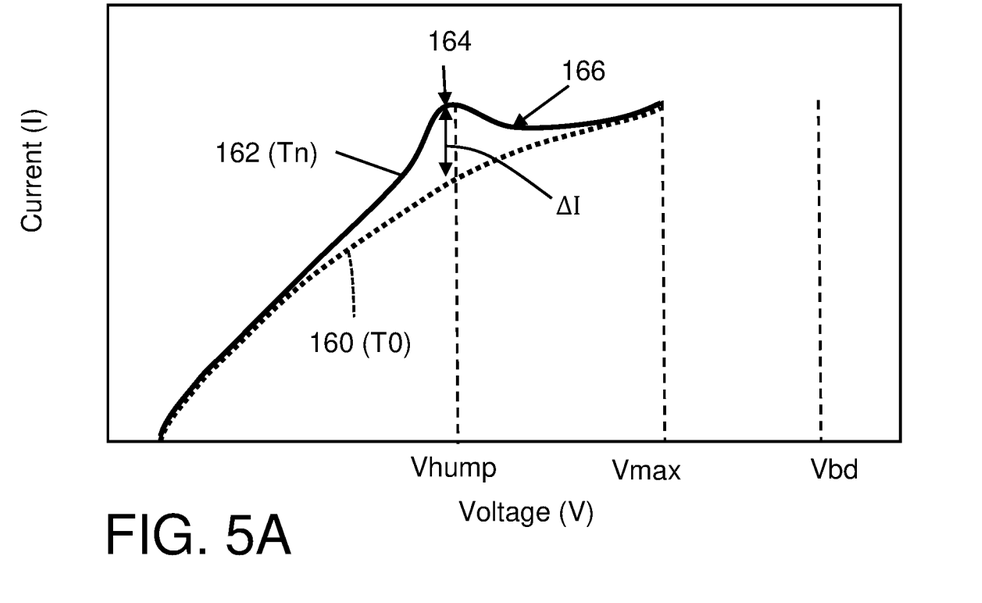
FIGS. 5A-B show graphs of current-voltage response curves employed by a moisture detector, according to embodiments of the disclosure.
Figure 5B:
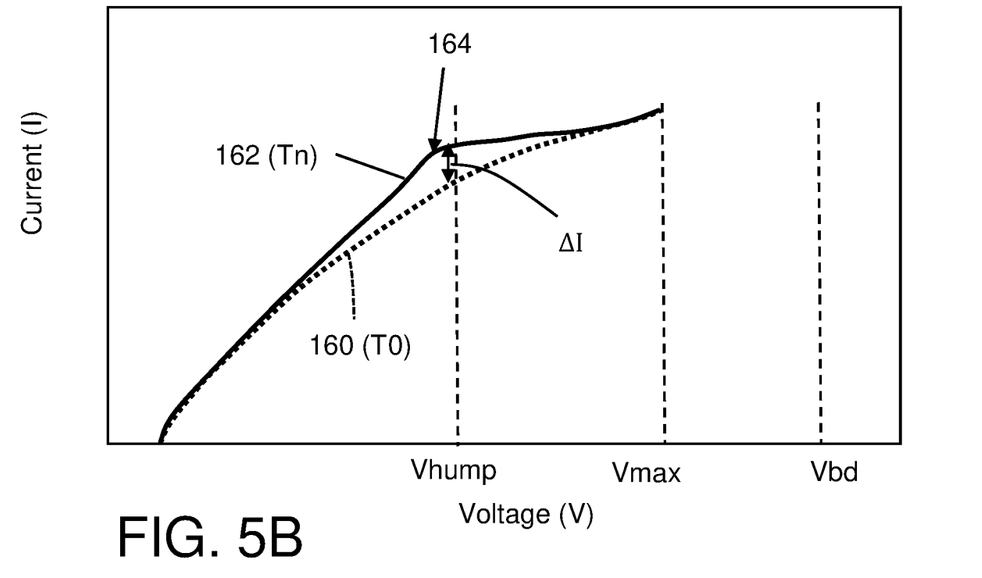

FIGS. 5A-B show graphs of current-voltage (I-V) response curves 160, 162 employed by moisture detector 150 to identify moisture ingress into IC structure 100; and FIGS. 6-10 show flow diagrams of a method of operation of moisture detector 150 according to various embodiments of the disclosure.

Figure 6:
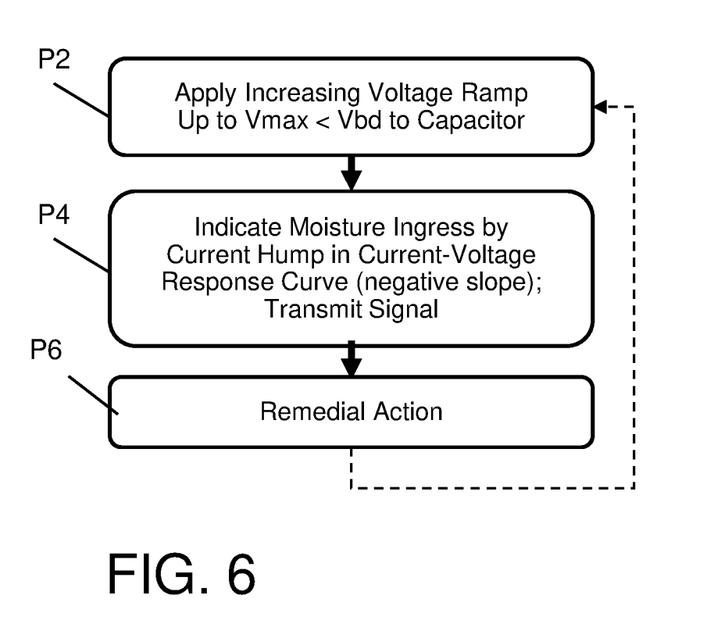
FIG. 6 shows a flow diagram of a method of operating a moisture detector, according to embodiments of the disclosure.

FIG. 6 shows a general method of operation of moisture detector 150 according to embodiments of the disclosure. In certain embodiments, as shown in process P2 in FIG. 6, moisture detector 150 is configured to apply an increasing voltage ramp to capacitor(s) 130 up to a maximum voltage (Vmax) that is less than a breakdown voltage (Vbd) of capacitor 130. The range of voltage and the maximum voltage used in any increasing voltage ramp described herein may vary depending on a number of factors, including but not limited to: technology node of IC structure 100, capacitor 130 configuration, which capacitor(s) 130 is/are being tested, dielectric material used in the capacitor(s) 130, and spacing between the two electrodes of the capacitor(s) 130. As shown in FIGS. 5A-B, Vmax is selected as a value sufficiently below Vbd to avoid breakdown of capacitor 130, but to include a voltage at which a current hump 164 occurs. Current hump 164 is indicative of a current increase in capacitor(s) 130 that occurs in the presence of moisture. In certain embodiments, Vmax may be approximately 75% of Vbd; however, other percentages are possible.

As shown in the graphs of FIGS. 5A-B and process P4 in FIG. 6, in certain embodiments, moisture detector 150 indicates moisture ingress in response to determining that a current hump 164 exists in a test current-voltage (I-V) response curve 162 of capacitor 130 (in response) to the increasing voltage ramp applied thereto. That is, moisture ingress is identified as existing when test I-V response curve 162 includes an (unexpected) rise in current represented by a hump or bump 164 in current in the I-V response curve, i.e., a "current hump." The voltage (Vhump) at which hump 164 exists can vary based on a wide variety of factors including but not limited to: technology node of IC structure 100, capacitor 130 configuration, dielectric material used in capacitor(s) 130, and spacing between the two electrodes of the capacitor(s) 130. Current in capacitor(s) 130 is/are highly sensitive to the presence of moisture in IC structure 100, allowing moisture detector 150 to detect moisture with accuracy, high sensitivity. Moisture detector 150 also detects moisture early in the testing, so remedial action can be taken prior to failure-level damage occurring. Further, as illustrated in FIGS. 5A-B, if current hump 164 exists in test I-V curve 162, it exists at a voltage (Vhump) less than maximum voltage Vmax of the increasing voltage ramp. In this manner, moisture ingress detection using moisture detector 150 is non-destructive. Hence, moisture detector 150 can be used during operation of IC structure 100 and in a final IC product, not just a test version of IC structure 100. In one non-limiting example, if moisture exists in IC structure 100, Vhump may be anticipated at approximately 50% of Vbd. Process P2 also includes moisture detector 150 transmitting a signal to active circuitry 102 to indicate a presence of moisture in IC structure 100.

Current hump 164 may be identified by moisture detector 150 in a number of ways. In one embodiment, as shown in FIG. 5A, current hump 164 may be indicated by a negative slope 166 in test I-V response curve 162. That is, current reaches a peak value (e.g., at Vhump) and then declines, creating negative slope 166 in test I-V response curve 162. Alternatively, moisture detector 150 may identify current hump 164 by current declining from a peak. This approach does not require measuring a reference I-V response curve 162 at the beginning of the monitoring of IC structure 102 for moisture ingress.

In process P6 in FIG. 6, any necessary remedial action can be taken. The remedial action can take a variety of forms. In one embodiment, moisture detector 150 may deactivate certain active circuitry 102 exposed to moisture. In another embodiment, moisture detector 150 may deactivate certain active circuitry 102 exposed to moisture and activate redundant active circuitry 102. In another embodiment, moisture detector 150 may indicate replacement of IC structure 100 is required, e.g., at a certain time or immediately. Where remedial action is not immediately required, moisture detector 150 may optionally continue IC structure 100 operation and continue periodic moisture ingress testing, i.e., from process P2 forward—see dashed line.

Figure 7:
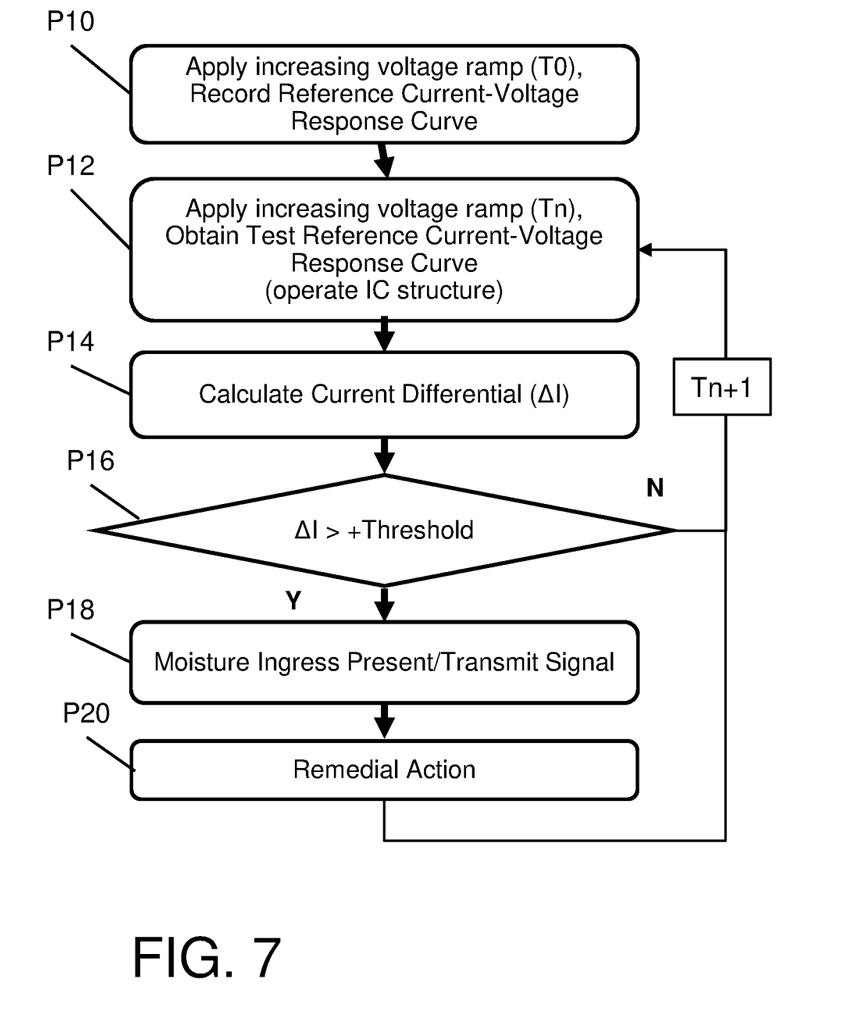
FIG. 7 shows a flow diagram of a method of operating a moisture detector, according to other embodiments of the disclosure.

FIG. 7 shows a method of operation of moisture detector 150 according to other embodiments of the disclosure. Referring to FIGS. 1, 4, 5A-B and 7, in process P10, moisture detector 150 first applies the increasing voltage ramp to capacitor(s) 130 and records a reference I-V response curve 160 of capacitor(s) 130 in response to the increasing voltage ramp. Process P10 is carried out at the beginning of use of IC structure 100 when no moisture ingress exists, i.e., at or near an initial time (T0) of operation of IC structure 100. Consequently, reference I-V response curve 160 does not include a current hump 164 therein. Process P10 also includes recording reference I-V response curve 160 for future use. Curve 160 can be stored in memory or otherwise recorded in IC structure 100 and/or moisture detector 150 in any manner.

In process P12, during actual operation of IC structure 100 or during a test operation of IC structure 100, moisture detector 150 applies the increasing voltage ramp to capacitor(s) 130 to obtain a test I-V response curve 162 of capacitor(s) 130 to the increasing voltage ramp. The application occurs at a subsequent time (Tn) from time T0. The application creates test I-V response curve 162 that will be different than reference I-V response curve 160 when moisture ingress exists in IC structure 100.

In processes P14-P16, moisture detector 150 determines the existence of current hump 164. In one embodiment, as described previously, current hump 164 may be indicated by a negative slope 166 in test I-V response curve 162. That is, current reaches a peak value (e.g., at Vhump) and then declines, creating negative slope 166 in test I-V response curve 162. Alternatively, moisture detector 150 may identify current hump 164 by current declining from a peak. According to the FIG. 7 embodiment, moisture detector 150 may determine the existence of current hump 164 by calculating a current differential ΔI existing between test I-V response curve 162 compared to reference I-V response curve 160. As illustrated, if current differential ΔI exists in test I-V curve 162, it exists at a voltage (Vhump) less than maximum voltage Vmax of the increasing voltage ramp. A positive threshold may be predetermined to dictate what value of current differential ΔI must exist, i.e., how much current must rise in a positive direction, between reference I-V response curve 160 to test I-V response curve 162 to indicate current hump 164 is present. Note, positive threshold is denoted "+Threshold" in the drawings for clarity. The positive threshold can be set based on a number of factors such as but not limited to technology node of IC structure 100, capacitor 130 configuration, dielectric material used in capacitor(s) 130, spacing between the two electrodes of capacitor(s) 130. In response to the current differential ΔI not exceeding a positive threshold, i.e., No at process P16, moisture detector 150 repeats the applying of (process P12) and the calculating (process P14), i.e., next increment of time Tn+1. The frequency of the re-testing can be user defined. In response to the current differential ΔI exceeding a positive threshold, i.e., Yes at process P16, moisture detector 150 transmits a signal to active circuitry 102 to indicate the presence of moisture in IC structure 102.

In process P20, upon indication of moisture ingress, any desired remedial action may occur, as previously described herein relative to process P6 in FIG. 6.

Figure 8:
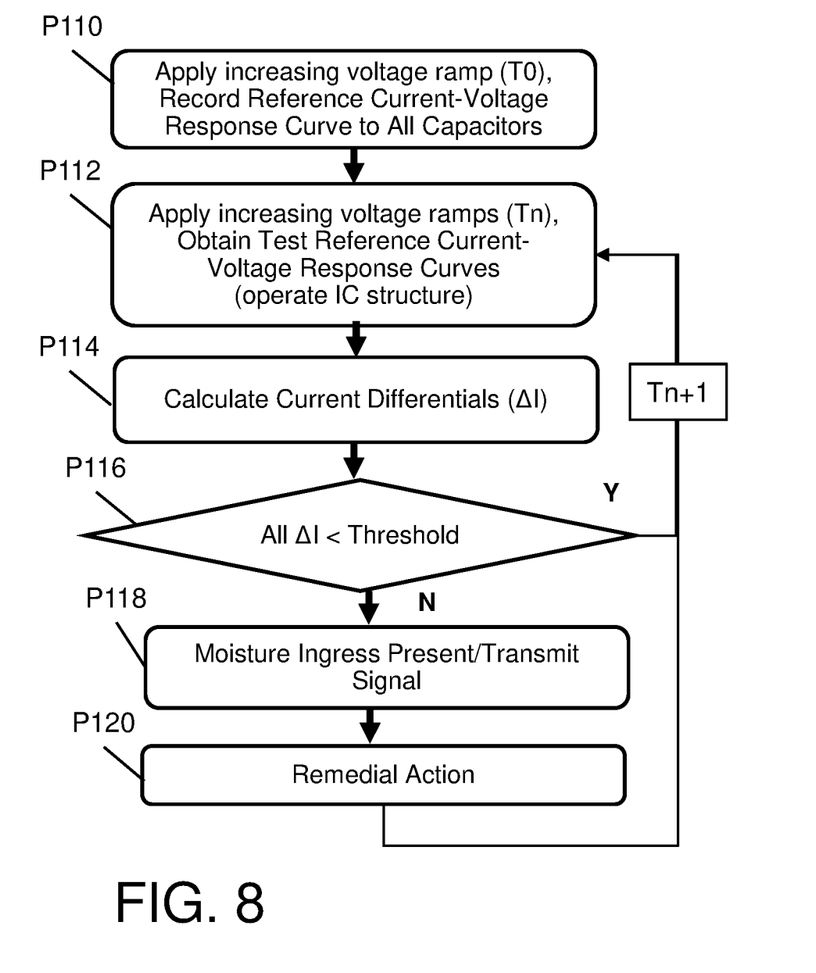
FIG. 8 shows a flow diagram of a method of operating a moisture detector, according to additional embodiments of the disclosure.

Referring again to FIG. 3, in certain embodiments, capacitor 130 includes a plurality of capacitors 148. FIG. 8 shows a flow diagram of a method of operation of moisture detector 150 according to another embodiment where plurality of capacitors 148 are used. With reference to FIGS. 3, 5A-B and 8, in process P110, moisture detector 150 applies the increasing voltage ramp to all capacitor(s) 130 in plurality of capacitors 148 and records a reference I-V response curve 160 (FIGS. 5A-B) of all (each) capacitor(s) 130 in response to the increasing voltage ramp. The increasing voltage ramp is applied to each capacitor 130 up to less than the breakdown voltage Vbd of each respective capacitor 130. Process P110 is carried out at the beginning of use of IC structure 100 when no moisture ingress exists, i.e., at or near an initial time (T0) of operation of IC structure 100. Consequently, reference I-V response curves 160 do not include a current hump 164 therein. Process P110 also includes recording reference I-V response curves 160 (FIGS. 5A-B) for future use. Curves 160 can be stored in memory or otherwise recorded in IC structure 100 and/or moisture detector 150 in any manner.

In process P112, during actual operation of IC structure 100 or during a test operation of IC structure 100, moisture detector 150 applies the increasing voltage ramp to plurality of capacitors 148 to obtain a test I-V response curve 162 of capacitor(s) 130 to the increasing voltage ramp. The application occurs at a subsequent time (Tn) from time T0. The application creates test I-V response curves 162 that will be different than reference I-V response curve 160 when moisture ingress exists in IC structure 100.

In processes P114-P116, moisture detector 150 determines the existence of current hump 164. In one embodiment, as described previously, current hump 164 may be indicated by a negative slope 166 in test I-V response curve 162. That is, current reaches a peak value (e.g., at Vhump)

and then declines, creating negative slope 166 in test I-V response curve 162. Alternatively, current hump 164 may be identified by current declining from a peak. According to the FIG. 8 embodiment, moisture detector 150 determines the existence of current hump 164 by calculating a current differential ΔI existing between test I-V response curve 162 compared to reference I-V response curve 160 for each capacitor 130 of the plurality of capacitors 148. As illustrated, if current differential(s) ΔI exists in any of test I-V curves 162, it exists at a voltage (Vhump) less than maximum voltage Vmax of the increasing voltage ramp. A positive threshold may be predetermined to dictate what value of current differential ΔI must exist for, i.e., how much current must rise, between reference I-V response curve 160 to test I-V response curve 162 to indicate current hump 164 is present. The positive threshold can be set the same for all of plurality of capacitors 148 or for individual capacitors 130 based on a number of factors such as but not limited to technology node of IC structure 100, each capacitor's configuration, dielectric material used in the capacitor 130, spacing between the two electrodes of the capacitor 130. In response to all current differentials ΔI not exceeding a positive threshold (indicated as "All ΔI<positive threshold"), i.e., No at process P116, moisture detector 150 repeats the applying of (process P112) and the calculating (process P114), i.e., next increment of time Tn+1. The frequency and amount of re-testing can be user defined. In response to at least one current differential ΔI exceeding a positive threshold, i.e., Yes at process P116, moisture detector 150 transmits a signal to active circuitry 102 to indicate the presence of moisture in IC structure 102.

In process P120, upon indication of moisture ingress, any desired remedial action may occur. The remedial action can include any action described herein relative to process P6 in FIG. 6.

Figure 9:
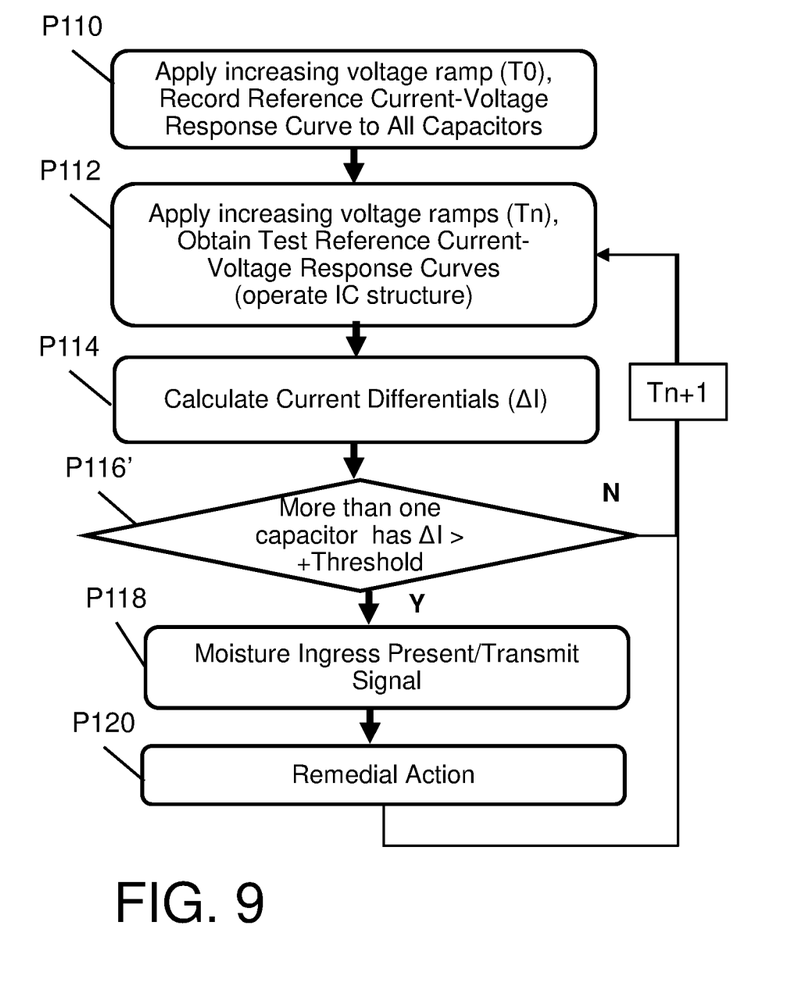
FIG. 9 shows a flow diagram of a method of operating a moisture detector, according to embodiments of the disclosure.

FIG. 9 shows a flow diagram of a method of operation of moisture detector 150 according to an alternative embodiment where plurality of capacitors 148 are used. FIG. 9 is identical to FIG. 8 except transmitting the signal to active circuitry 102 to indicate the presence of moisture in IC structure 100 occurs only in response to current hump 164 existing in the test I-V response curve for more than one capacitor 130. In one embodiment, as described previously, current hump 164 may be indicated by a negative slope 166 in test I-V response curve 162. That is, current reaches a peak value (e.g., at Vhump) and then declines, creating negative slope 166 in test I-V response curve 162. Alternatively, current hump 164 may be identified by current declining from a peak. According to the FIG. 9 embodiment, a current differential ΔI for more than one capacitor 130 must exceed a positive threshold. More particularly, at process P116', in response to more than one capacitor 130 having a current differential ΔI exceeding a positive threshold, i.e., Yes at process P116', moisture detector 150 transmits a signal to active circuitry 102 to indicate the presence of moisture in IC structure 102. Otherwise, where less than two capacitors 130 having a current differential ΔI exceed a positive threshold, i.e., No at process P116', moisture detector 150 repeats the applying of (process P112) and the calculating (process P114), i.e., next increment of time Tn+1. The frequency of re-testing can be user defined. As illustrated, the flow of FIG. 9 is identical to that of FIG. 8 except at process P116'.

Figure 10:
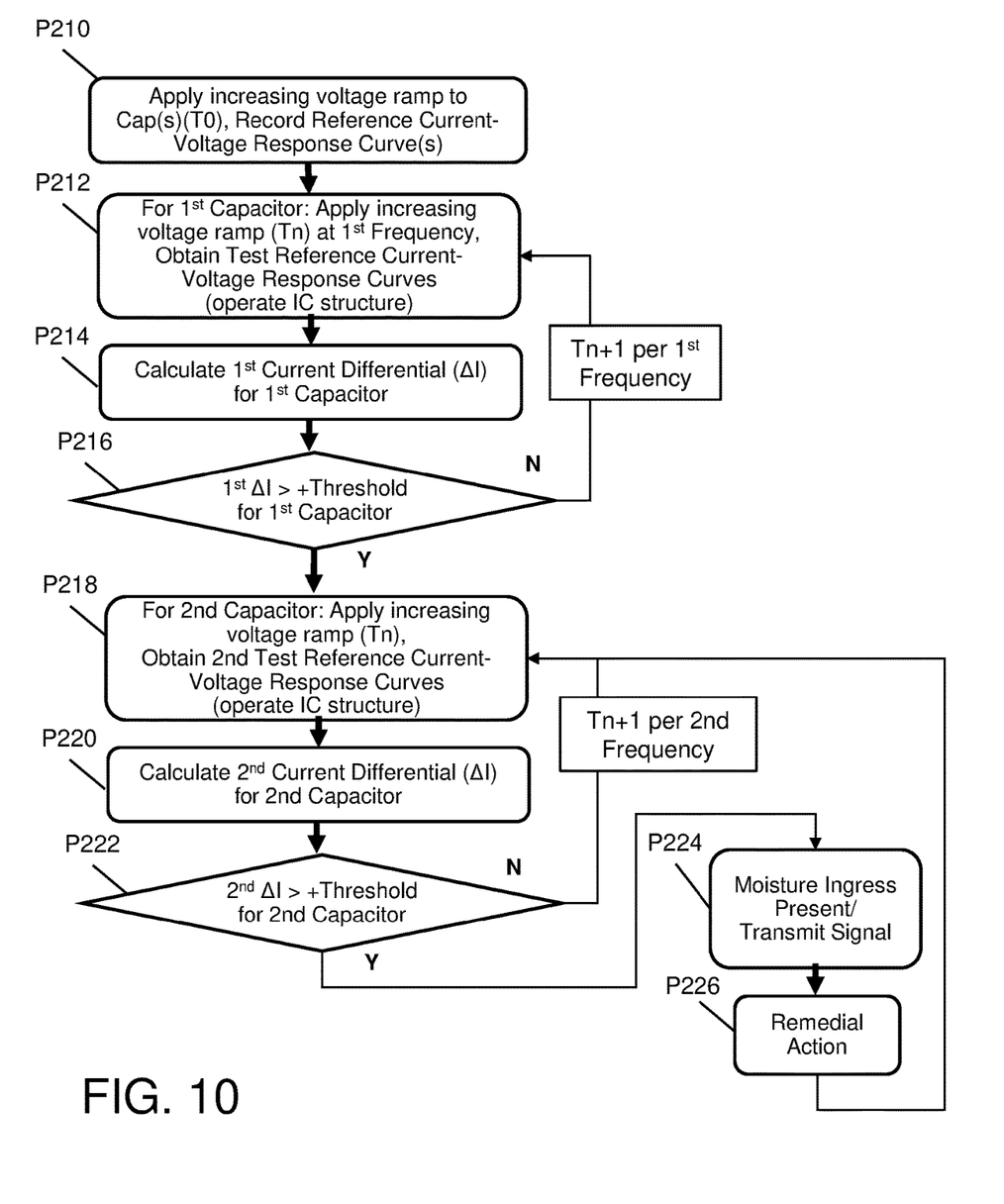
FIG. 10 shows a flow diagram of a method of operating a moisture detector, according to other embodiments of the disclosure.

FIG. 10 shows a flow diagram of a method of operation of moisture detector 150 according to another alternative embodiment where plurality of capacitors 148 are used. The FIG. 10 flow implements of a method of operating moisture detector 150 that confirms moisture ingress once an initial indication by one capacitor 130 occurs. Here, more than one capacitor 130 must indicate moisture ingress, i.e., via the existence of a current hump in a test I-V response curve thereof, before remedial action is taken. In this manner, an initial moisture ingress indication within a given location of IC structure 100 can be confirmed, or moisture ingress indications at different, perhaps distant, locations within IC structure 100 can be required before remedial action is taken.

With reference to FIGS. 3, 5A-B and 10, in process P210, at the beginning of operation of IC structure 100, moisture detector 150 (first) applies the increasing voltage ramp to at least one capacitor, e.g., 130(1)-130(n) in FIG. 3, of plurality of capacitors 148 and records a reference I-V response curve 160 for each capacitor 130(1)-130(n) to the increasing voltage ramp. More particularly, where plurality of capacitors 130(1)-130(n) (FIG. 3) are identical, only one capacitor 130(1)-130(n) (FIG. 3) needs to be tested and only one reference I-V response curve 160 needs to be recorded. That is, because all of capacitors 130(1)-130(n) are identical, all of the reference I-V response curves 160 would be identical, and only one needs to be recorded. Alternatively, where plurality of capacitors 130(1)-130(n) (FIG. 3) are not identical, each type of different capacitor 130(1)-130(n) (FIG. 3) needs to be tested and each type of different capacitor 130(1)-130(n) (FIG. 3) will have its respective reference I-V response curve 160 recorded. More particularly, where some of capacitors 130(1)-130(2) (FIG. 3) are of the same identical structure (i.e., same type) and some capacitors 130(3)-130(4) (FIG. 3) are of the same identical structure (i.e., same type), then there will be a reference I-V response curve 160 for each type. And, where all of capacitors 130(1)-130(n) (FIG. 3) are different, there will be a reference I-V response curve 160 for each of them. Process P210 is carried out at the beginning of use of IC structure 100 when no moisture ingress exists, i.e., at or near an initial time (T0) of operation of IC structure 100. Consequently, reference I-V response curve(s) 160 do not include a current hump 164 therein. Curve(s) 160 can be stored in memory or otherwise recorded in IC structure 100 and/or moisture detector 150 in any manner. In process P212, as described herein, during operation of IC structure 100, moisture detector 150 (second) applies the increasing voltage ramp to a first capacitor 130(1) of plurality of capacitors 148 to obtain a first test I-V response curve 162 of first capacitor 130(1) to the increasing voltage ramp.

In process P214, moisture detector 150 determines whether a first current hump 164 exists in test I-V response curve 162. In one embodiment, as described previously, current hump 164 may be indicated by a negative slope 166 in test I-V response curve 162. That is, current reaches a peak value (e.g., at Vhump) and then declines, creating negative slope 166 in test I-V response curve 162. Alternatively, current hump 164 may be identified by current declining from a peak. According to the FIG. 10 embodiment, moisture detector 150 determines whether current hump 164 exists by (first) calculating a first current differential ΔI existing in first test I-V response curve 162 compared to a reference I-V response curve 160 for first capacitor 130(1) of plurality of capacitors 148, i.e., a reference I-V response curve 160 specifically for first capacitor 130(1), a reference I-V response curve 160 specifically for capacitors its type, or, where all capacitors 130(1)-130(n) are identical, then the single reference I-V response curve 160 for all of the capacitors.

In process P216, in response to first current differential ($1^{st}$ ΔI) for first capacitor 130(1) not exceeding a positive threshold, moisture detector 150 repeats the applying (process P212) and the calculating of (process P214) for first capacitor 130(1). The duration between re-testing (applying and calculating) can be at a first frequency, which can be user defined, i.e., next increment of time Tn+1. For purposes of description only, first frequency may be one week.

In response to first current differential ($1^{st}$ ΔI) of first capacitor 130(1) exceeding a positive threshold, i.e., Yes at P216, at process P218, during operation of IC structure 100, moisture detector 150 (third) applies the increasing voltage ramp to second capacitor 130(2) of plurality of capacitors 148 to obtain a second test I-V response curve 162 of second capacitor 130(1) to the increasing voltage ramp. The increasing voltage ramps for reference and testing purposes (processes P210, P212) for first capacitor 130(1) are the same, and the increasing voltage ramps for reference and testing purposes (processes P218, P220) for second capacitor 130(2) are the same. The increasing voltage ramps for first capacitor 130(1) and those for second capacitor 130(2) may be the same or they may be different depending on, for example, whether capacitors 130(1), 130(2) are identical in configuration and/or position within IC structure 100.

In processes P220-P222, moisture detector 150 determines the existence of a second current hump 164 in second test I-V response curve 162. In one embodiment, as described previously, current hump 164 may be indicated by a negative slope 166 in test I-V response curve 162. That is, current reaches a peak value (e.g., at Vhump) and then declines, creating negative slope 166 in test I-V response curve 162. Alternatively, current hump 164 may be identified by current declining from a peak. According to the FIG. 10 embodiment, moisture detector 150 determines the existence of current hump 164 by, in process P220, (second) calculating a second current differential ($2^{nd}$ ΔI) existing in second test I-V response curve 162 compared to a reference I-V response curve 160 for second capacitor 130(2) of plurality of capacitors 148. As previously described, the reference I-V response curve 160 may be specifically for second capacitor 130(2), a reference I-V response curve 160 specifically for capacitors of its type, or, where all capacitors 130(1)-130(n) are identical, then the single reference I-V response curve 160 for all capacitors 130(1)-130(n).

In process P222, in response to second current differential (2nd ΔI) for second capacitor 130(2) not exceeding a second positive threshold, moisture detector 150 repeats the applying (process P218) and the calculating of (process P220) for second capacitor 130(2). The second positive threshold may be the same as, or different than, the first positive threshold. A different, larger positive threshold may be desired, for example, to require a larger current differential for moisture ingress confirmation compared to the initial moisture ingress indication. The duration between re-testing (applying and calculating) can be at a second frequency, i.e., next increment of time Tn+1. The second frequency can be user defined to test for moisture at any periodic duration, but is typically higher than the first frequency, e.g., once a week or once a day, due to the initial moisture ingress indication. For purposes of description only, second frequency may be weekly.

In process P224, in response to current differential of the second, different capacitor 130(2) exceeding the second positive threshold, i.e., Yes at process P222, moisture detector 150 transmits the signal to active circuitry 102 to indicate the presence of moisture in IC structure 100. While the moisture ingress confirmation process of FIG. 10 has been shown to be performed once, it will be recognized that any number of confirmations can be carried out. For example, moisture ingress may be required of three capacitors 130 at different locations within IC structure 100.

In process P226, upon indication of moisture ingress, any desired remedial action may occur. The remedial action can include any action described herein relative to process P6 in FIG. 6.

IC structure 100, including capacitor(s) 130 and moisture detector 150, can be formed using any now known or later developed semiconductor manufacture techniques.

Embodiments of the disclosure provide various technical and commercial advantages, examples of which are discussed herein. The moisture detector and related methods provide a more sensitive and accurate manner to identify moisture ingress. Any current hump occurs relatively early in a current-voltage response curve, and well before any voltage breakdown shift. The moisture detector and related methods are non-destructive and can be used after IC structure fabrication, and/or during operation in the field.

The structure and method as described above are used in the fabrication of integrated circuit chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a moisture barrier about active circuitry;
   a capacitor entirely inside the moisture barrier, the capacitor having a breakdown voltage; and
   a moisture detector configured to apply an increasing voltage ramp to the capacitor up to a maximum voltage less than the breakdown voltage of the capacitor and in response to determining that a current hump exists in a test current-voltage response curve of the capacitor to the increasing voltage ramp, transmitting a signal to the active circuitry to indicate a presence of moisture in the IC structure.

2. The IC structure of claim 1, wherein the current hump is indicated by a negative slope in the test current-voltage response curve.

3. The IC structure of claim 1, wherein the moisture detector performs the processes:
   first applying the increasing voltage ramp to the capacitor and recording a reference current-voltage response curve of the capacitor to the increasing voltage ramp;
   second applying the increasing voltage ramp to the capacitor to obtain a test current-voltage response curve of the capacitor to the increasing voltage ramp;
   determining the existence of the current hump by calculating a current differential existing in the test current-voltage response curve compared to the reference current-voltage response curve, the current differential existing at a voltage less than the maximum voltage of the increasing voltage ramp;
   in response to the current differential not exceeding a positive threshold, repeating the second applying and the calculating; and
   in response to the current differential exceeding a positive threshold, transmitting the signal to the active circuitry to indicate the presence of moisture in the IC structure.

4. The IC structure of claim 3, wherein the capacitor includes a plurality of capacitors, and
   wherein the second applying includes applying the increasing voltage ramp to each capacitor up to less than the breakdown voltage of the respective capacitor, and
   wherein the calculating includes calculating the current differential existing in the test current-voltage response curve compared to the reference current-voltage response curve for each capacitor of the plurality of capacitors;
   wherein in response to all of the current differentials not exceeding a positive threshold, the moisture detector repeats the second applying and the calculating for the plurality of capacitors; and
   in response to at least one of the current differentials exceeding a positive threshold, the moisture detector transmits the signal to active circuitry to indicate the presence of moisture in the IC structure.

5. The IC structure of claim 3, wherein the transmitting the signal to active circuitry to indicate the presence of moisture in the IC structure occurs only in response to more than one capacitor having a test current-voltage response curve having the respective current differential exceed a positive threshold.

6. The IC structure of claim 1, wherein the capacitor includes a plurality of capacitors and the moisture detector performs the processes:
   first applying the increasing voltage ramp to at least one capacitor of the plurality of capacitors and recording a reference current-voltage response curve for each capacitor to the increasing voltage ramp;
   second applying the increasing voltage ramp to a first capacitor of the plurality of capacitors to obtain a first test current-voltage response curve of the first capacitor to the increasing voltage ramp, and
   determining the existence of the current hump includes determining the existence of a first current hump by first calculating a first current differential existing in the first test current-voltage response curve compared to a reference current-voltage response curve for the first capacitor of the plurality of capacitors;
   in response to the first current differential not exceeding a first positive threshold, repeating the second applying and the first calculating for the first capacitor of the plurality of capacitors;
   in response to the first current differential exceeding a positive threshold:
      third applying the increasing voltage ramp to a second capacitor of the plurality of capacitors different than the first capacitor to obtain a second test current-voltage response curve of the second capacitor to the increasing voltage ramp, and
      determining the existence of a second current hump by second calculating a second current differential existing in the second test current-voltage response curve compared to a reference current-voltage response curve for the second capacitor of the plurality of capacitors;
      in response to the second current differential not exceeding a second positive threshold, repeating the third applying and the second calculating for the second capacitor of the plurality of capacitors; and
      in response to the second current differential exceeding the second positive threshold, transmitting the signal to the active circuitry to indicate the presence of moisture in the IC structure.

7. The IC structure of claim 1, wherein the capacitor is located adjacent a moisture ingress path in the moisture barrier.

8. The IC structure of claim 7, wherein the capacitor is located within 10000 nanometers of the moisture ingress path.

9. The IC structure of claim 1, wherein the capacitor is located more than $1 \times 10^7$ nanometers from a moisture ingress path in the moisture barrier.

10. The IC structure of claim 1, further comprising a photonics component adjacent a moisture ingress path in the moisture barrier.

11. The IC structure of claim 1, wherein the capacitor includes a metal-insulator-metal (MIM) capacitor entirely within the moisture barrier and including a first metal electrode separated from a second metal electrode by a dielectric layer, wherein the first metal electrode includes a first plurality of digitated elements, and the second metal electrode includes a second plurality of digitated elements.

12. An integrated circuit (IC) structure, comprising:
a moisture barrier about active circuitry;
a capacitor entirely inside the moisture barrier, the capacitor having a breakdown voltage; and
a moisture detector configured to:
first apply an increasing voltage ramp to the capacitor and record a reference current-voltage response curve of the capacitor to the increasing voltage ramp;
second apply the increasing voltage ramp to the capacitor to obtain a test current-voltage response curve of the capacitor to the increasing voltage ramp;
determine the existence of a current hump in a test current-voltage response curve of the capacitor to the increasing voltage ramp by calculating a current differential existing in the test current-voltage response curve compared to the reference current-voltage response curve, the current differential existing at a voltage less than the maximum voltage of the increasing voltage ramp;
in response to the current differential not exceeding a positive threshold, repeating the second applying and the calculating; and
in response to the current differential exceeding a positive threshold, transmitting a signal to the active circuitry to indicate the presence of moisture in the IC structure.

13. The IC structure of claim 12, wherein the current hump is indicated by a negative slope in the test current-voltage response curve.

14. The IC structure of claim 12, wherein the capacitor includes a plurality of capacitors, and
wherein the increasing voltage ramp is applied to each capacitor up to less than the breakdown voltage of the respective capacitor, and
wherein the calculating includes calculating the current differential existing in the test current-voltage response curve compared to the reference current-voltage response curve for each capacitor of the plurality of capacitors;
wherein in response to all of the current differentials not exceeding a positive threshold, the moisture detector repeats the second applying and the calculating for the plurality of capacitors; and
in response to at least one of the current differentials exceeding a positive threshold, transmitting the signal to active circuitry to indicate the presence of moisture in the IC structure.

15. A method, comprising:
applying an increasing voltage ramp to at least one capacitor in an integrated circuit (IC) structure up to less than a breakdown voltage of the at least one capacitor, each capacitor positioned entirely within a moisture barrier of the IC structure; and
in response to a current hump existing in a current-voltage response curve of the at least one capacitor to the increasing voltage ramp, transmitting a signal to the active circuitry to indicate a presence of moisture in the IC structure.

16. The method of claim 15, wherein the current hump is indicated by a negative slope in the current-voltage response curve.

17. The method of claim 15, wherein the applying includes:
first applying the increasing voltage ramp to the capacitor and recording a reference current-voltage response curve of the capacitor to the increasing voltage ramp; and
second applying the increasing voltage ramp to the capacitor to obtain a test current- voltage response curve of the capacitor to the increasing voltage ramp;
wherein determining the existence of the current hump includes:
calculating a current differential existing in the test current-voltage response curve compared to the reference current-voltage response curve, the current differential existing at a voltage less than the maximum voltage of the increasing voltage ramp;
in response to the current differential not exceeding a positive threshold, repeating the second applying and the calculating; and
in response to the current differential exceeding a positive threshold, indicating the existence of the current hump, transmitting the signal to the active circuitry to indicate the presence of moisture in the IC structure.

18. The method of claim 17, wherein the capacitor includes a plurality of capacitors, and wherein the increasing voltage ramp is applied to each capacitor up to less than the breakdown voltage of the respective capacitor;
wherein the calculating includes calculating the current differential existing in the test current-voltage response curve compared to the reference current-voltage response curve for each capacitor of the plurality of capacitors;
wherein in response to all of the current differentials not exceeding a positive threshold, the moisture detector repeats the second applying and the calculating for the plurality of capacitors; and
in response to at least one of the current differentials exceeding a positive threshold, indicating the existence of the current hump, transmitting the signal to the active circuitry to indicate the presence of moisture in the IC structure.

19. The method of claim 18, wherein the transmitting the signal to active circuitry to indicate the presence of moisture in the IC structure occurs only in response to more than one capacitor having a test current-voltage response curve having the respective current differential exceed a positive threshold.

20. The method of claim 15, wherein the capacitor includes a plurality of capacitors and the moisture detector performs the processes:
first applying the increasing voltage ramp to at least one capacitor of the plurality of capacitors and recording a reference current-voltage response curve for each capacitor to the increasing voltage ramp;
second applying the increasing voltage ramp to a first capacitor of the plurality of capacitors to obtain a first test current-voltage response curve of the first capacitor to the increasing voltage ramp, and
determining the existence of the current hump includes determining the existence of a first current hump by first calculating a first current differential existing in the first test current- voltage response curve compared to a reference current-voltage response curve for the first capacitor of the plurality of capacitors;

in response to the first current differential not exceeding a first positive threshold, repeating the second applying and the first calculating for the first capacitor of the plurality of capacitors;

in response to the first current differential exceeding a positive threshold:

third applying the increasing voltage ramp to a second capacitor of the plurality of capacitors different than the first capacitor to obtain a second test current-voltage response curve of the second capacitor to the increasing voltage ramp, and determining the existence of a second current hump by second calculating a second current differential existing in the second test current-voltage response curve compared to a reference current-voltage response curve for the second capacitor of the plurality of capacitors;

in response to the second current differential not exceeding a second positive threshold, repeating the third applying and the second calculating for the second capacitor of the plurality of capacitors; and in response to the second current differential exceeding the second positive threshold, transmitting the signal to the active circuitry to indicate the presence of moisture in the IC structure.

\* \* \* \* \*